(12) United States Patent
Britz

(10) Patent No.: US 6,469,492 B1
(45) Date of Patent: Oct. 22, 2002

(54) PRECISION RMS MEASUREMENT

(75) Inventor: William J. Britz, Kirkland, WA (US)

(73) Assignee: Fluke Corporation, Everett, WA (US)

( * ) Notice: Subject to any disclaimer, the term of this patent is extended or adjusted under 35 U.S.C. 154(b) by 20 days.

(21) Appl. No.: 09/852,396

(22) Filed: May 9, 2001

(51) Int. Cl.[7] ............................................... G01R 15/00
(52) U.S. Cl. ...................................... 324/132; 327/348
(58) Field of Search ............................. 324/158.1, 119, 324/117 R, 132, 115, 140 R; 708/807, 805, 835; 700/286, 298, 445; 327/348, 347; 702/86, 85

(56) References Cited

U.S. PATENT DOCUMENTS

| | | | | |
|---|---|---|---|---|
| 4,786,859 A | * | 11/1988 | Arseneau et al. | ............ 324/132 |
| 5,446,371 A | * | 8/1995 | Eccleston et al. | ............ 324/115 |
| 5,790,432 A | * | 8/1998 | Morys | ........................ 324/115 |
| 6,064,193 A | * | 5/2000 | Hansen et al. | ............... 324/132 |

* cited by examiner

*Primary Examiner*—Michael Sherry
*Assistant Examiner*—Jimmy Nguyen
(74) *Attorney, Agent, or Firm*—George T. Noe

(57) ABSTRACT

A precision RMS measurement system is provided by extending the effective resolution of a medium-resolution sampling RMS converter. An AC or other time-varying cyclic signal is simultaneously applied to an average-responding AC-to-DC converter and to a high-speed medium resolution sampling analog-to-digital converter. The average voltage produced by the AC-to-DC converter is measured by a precision analog-to-digital converter to produce a highly accurate DC voltage measurement. The output of the sampling analog-to-digital converter is provided to a digital signal processor, which calculates the RMS and average values. A microprocessor then multiplies the ratio of the calculated RMS and average values by the highly-accurate DC average to produce a highly accurate RMS voltage. The precision RMS voltage is then displayed.

4 Claims, 2 Drawing Sheets

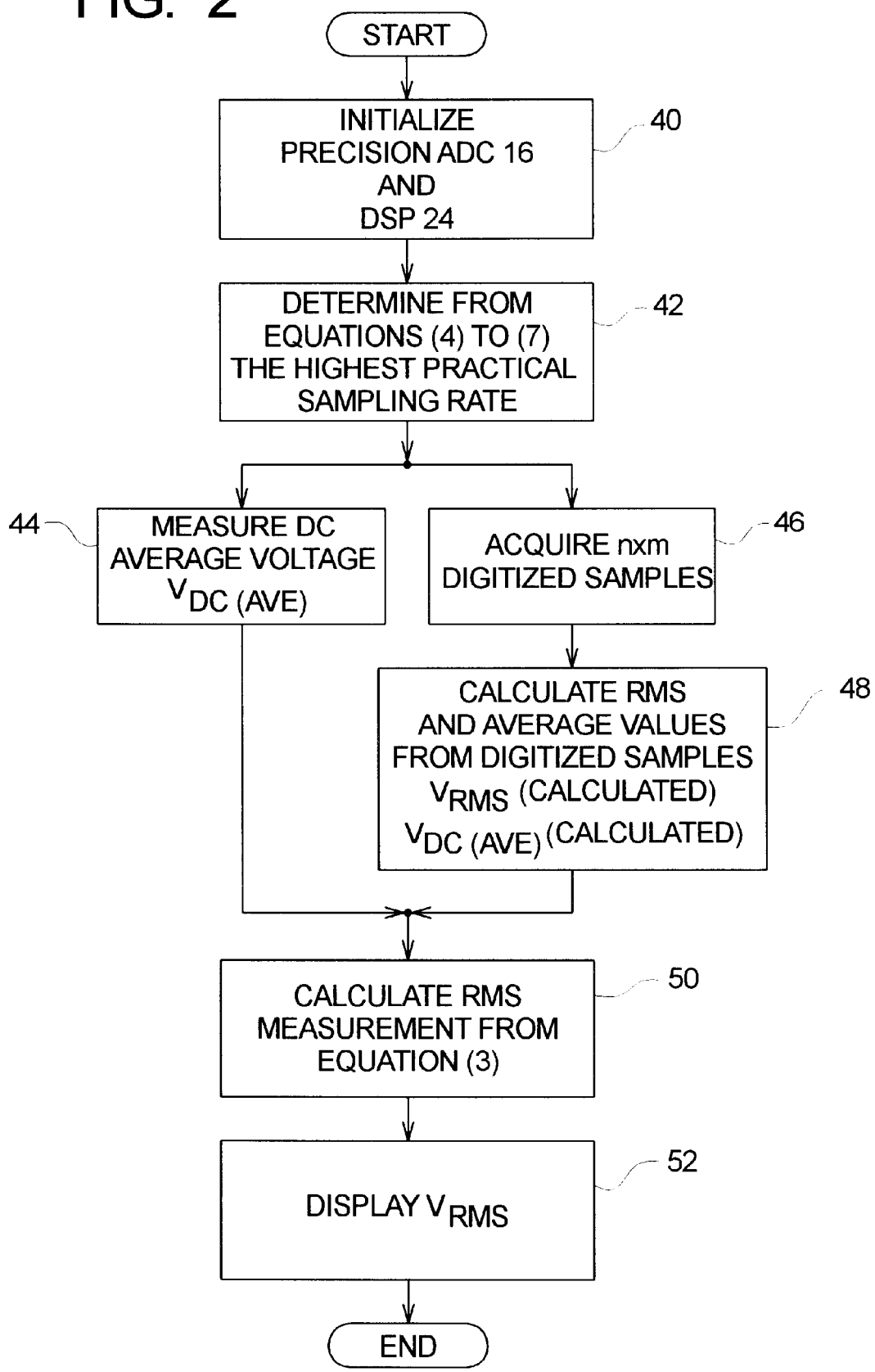

PRECISION RMS MEASUREMENT

BACKGROUND OF THE INVENTION

This invention relates generally to measurement of root-mean-square (RMS) voltages, and in particular to extending the effective resolution and accuracy of a medium-resolution sampling RMS converter.

There are many types of converters for measuring the RMS value of an AC signal, and RMS measurement is now a common feature found on many digital multimeters. The RMS measurement accuracy provided by these conventional RMS converters is sufficiently adequate for general-purpose measurements. Some digital multimeters are optimized to measure the average value of sine waves, such as 60-Hertz power line signals, but are not accurate for non-sinusoidal waves. This has led to a distinction of "true RMS" as opposed to just "RMS" measurements.

High quality laboratory digital multimeters require highly-accurate precision measurement systems. For precision RMS measurements, thermal converters provide high accuracy, but are bulky and comparatively slow because they. rely on translation of RMS to heat. Sampling RMS converters and so-called delta-sigma that provide high accuracy are available, but are very expensive and again are comparatively slow because of the time required to resolve to 20 bits or more.

SUMMARY OF THE INVENTION

In accordance with the present invention, a precision RMS measurement system is provided by extending the effective resolution of a medium-resolution sampling RMS converter.

An AC or other time-varying cyclic signal is simultaneously applied to an average-responding AC-to-DC converter and to a high-speed medium resolution sampling analog-to-digital converter. The average voltage produced by the AC-to-DC converter is applied to a precision analog-to-digital converter, which in turn produces a highly accurate digital representation of the average value. The output of the sampling analog-to-digital converter is provided to a digital signal processor, which calculates the RMS and average values. A microprocessor then multiplies the ratio of the calculated RMS and average values by the highly-accurate DC average. The result is that the units for the average voltages cancel, leaving only the RMS units in a now highly-accurate RMS voltage. Thus, the resolution of the sampling analog-to-digital converter has been effectively extended. The precision RMS voltage is then displayed.

Since the ratio of the calculated RMS and average values is used, resolution error is resolved out in the division, and so the sampling analog-to-digital converter does not need to be calibrated to achieve full accuracy. Only the linearity is important.

One feature of the present invention is to provide the highest possible sampling rate without sampling the same points on the waveform over and over.

Other objects, features, and advantages of the present invention will become obvious to those having ordinary skill in the art upon a reading of the following description when taken in conjunction with the accompanying drawings.

BRIEF DESCRIPTION OF THE DRAWINGS

FIG. 2 is a program listing showing operation of the system of FIG. 1.

DETAILED DESCRIPTION OF THE INVENTION

Figure 1:
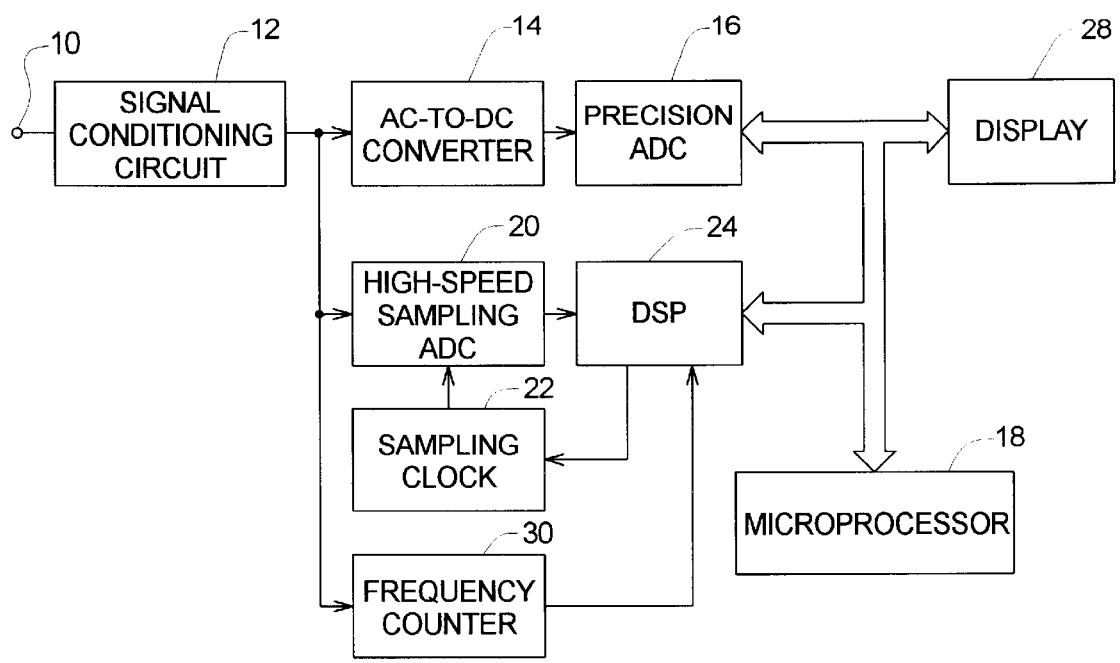
FIG. 1 is a block diagram representation of a precision RMS measurement system in accordance with the present invention.

Referring to FIG. 1 of the drawings, there is shown a block diagram of a precision RMS measurement system in accordance with the present invention. An unknown alternating-current (AC) or cyclic time-varying voltage signal is applied via an input terminal 10 to a signal conditioning circuit 12, where the signal is suitably scaled through amplification and attenuation to an amplitude suitable for measurement. Such signal conditioning circuits are well known in the art for use in test and measurement instrument instruments such as oscilloscopes and digital multimeters.

To facilitate discussion, the conditioned signal will be referred to as an AC voltage signal with the understanding that this term includes all time-varying cyclic voltage signals. The conditioned AC signal is split into two paths for further processing. In the first path, the conditioned AC signal is applied to an average-responding AC-to-DC converter 14, which produces a DC voltage $V_{DC,\,(Ave.)}$ that is a mathematic average of the absolute value of the AC signal. Such average-responding AC-to-DC converters are well known in the art, and the one used here is essentially an absolute-value amplifier (which full-wave rectifies the AC signal) followed by a low-pass filter to smooth out and take the average of the pulsating DC voltage. This DC average voltage $V_{DC,\,(Ave.)}$ is applied to a precision analog-to-digital converter (ADC) 16, which may suitably be a dual-slope ADC. A microprocessor 18 reads and stores the value $V_{DC,\,(Ave.)}$ for later use. The average-responding AC-to-DC converter 14 can be precisely calibrated using DC-only techniques.

In the second path, the conditioned AC signal is applied to a high-speed sampling ADC 20. Because the present invention effectively extends the resolution of the sampling ADC, a relatively inexpensive medium resolution, for example, 12 to 16 bits of resolution, converter may be used. ADC 20 samples the AC signal at a rate determined by a sampling clock generator 22 and produces a stream of digital data representing instantaneous values of the AC signal. These digital data, or "digitized samples," are applied to a digital-signal processor (DSP) 24. To obtain sufficient data that RMS and average voltage values can be calculated, n digitized samples per cycle over m cycles are collected.

DSP 24 calculates the RMS and average values from the digitized samples as follows:

$$V_{RMS}\text{ (calculated)} = \sqrt{\frac{\sum_{i=1}^{mn} V_i^2}{MN}}, \tag{1}$$

where $V_i$ is the voltage value of each of N digitized samples per cycle, and M is the number of whole cycles in a measurement period so that mn or MN is total number of digitized samples in a measurement period, and $$V_{DC,(Ave.)}\text{ (calculated)} = \frac{\sum_{i=1}^{mn} |V_i|}{MN}. \tag{2}$$

Finally, DSP 24 calculates the ratio value $$\varphi = \frac{V_{\text{RMS}} \text{ (calculated)}}{V_{DC,(Ave.)} \text{ (calculated)}}.$$

While the value of V in these calculations may not give rise to a precision measurement because the resolution of ADC 20 may be limited, the ratio of the calculated RMS and average voltages is quite precise. The importance of this will be seen shortly. And because the ratio is quite precise, ADC 20 does not need to be calibrated. Linearity of ADC 20, however, is important.

Microprocessor 18 reads the ratio value from DSP 24, and multiplies the precise value $V_{DC,(Ave.)}$ read earlier from precision ADC 16 by the ratio value φ to obtain a very precise RMS voltage value. That is, from the equation $$V_{\text{RMS}} = V_{DC,(Ave.)} \times \frac{V_{\text{RMS}} \text{ (calculated)}}{V_{DC,(Ave.)} \text{ (calculated)}}, \tag{3}$$

it can be seen that the units DC, (Ave.) for average voltage cancel out, leaving the RMS voltage units, and since the precise ratio φ has been multiplied by a precise average voltage, the resulting RMS voltage value is precise. Thus, the precision of the sampling ADC 20 has been extended. The precise RMS voltage is displayed on a display device 28, which may suitably be a liquid-crystal display (LDC) device displaying a digital readout in the form of alphanumeric characters.

In order for DSP 24 properly to collect n samples over m cycles to calculate the ratio value φ, the frequency of the sampling clock 22 must be known, and the frequency of the input signal must be adjustable to a precise setting.

If, for example, the RMS voltage of only 60-Hertz signals is desired, the DSP 24 may be programmed to measure signals over a period of time that is equal to an exact number of cycles. By way of example, the measurement period of 6 cycles of 60 Hertz signal is 100 milliseconds. Other measurement periods may be determined from the equation P=m/F, where P is the period, m is the number of cycles, and F is the frequency of the input signal. A sample clock frequency of four kilohertz will produce 400 samples over m cycles, which yields n=66.666 samples per cycle. A higher frequency will of course result in a larger number of samples over m cycles. If the number of samples n per cycle is an exact integer, the same points will sampled on each cycle, so some care must be taken in selecting a clock frequency that will produce sufficient samples over the measurement period.

However, there are many instances in which the input signal is not a 60-Hertz signal or even a sinusoidal wave, so it is necessary to determine or measure the frequency. For a more general purpose precision RMS measurement system, a frequency counter 30 may be added. Once the frequency is known, the time period for one cycle is also known since frequency and time are reciprocals of each other. Frequency counters are well known in the art, and have been used for many years in frequency counter instrumentation. An example of a conventional frequency counter is a window comparator followed by a flipflop to detect a cycle of the input signal that in turn gates on a counter circuit that counts high-speed clock pulses over the cycle to measure the time period thereof.

For a general purpose precision RMS measurement system, the relationship between the frequency of the input signal and the frequency of the sampling clock may be critical. For example, consider the case in which the input frequency $F_{in}$=200 kilohertz, and the sampling clock frequency $F_{clk}$=2 megahertz. Here, the period for one cycle is five microseconds and the sampling rate is 10 samples per cycle (one sample every 0.5 microsecond). This results in a large error because of the small number of samples per cycle, and because the same points on the input signal are sampled over and over. Thus, the number of n samples over m cycles is not meaningful because all the data that is going to be collected is done in one cycle. To remedy this problem, the sampling rate needs to be adjusted slightly so that sampling ADC 20 samples different points on each successive cycle as described earlier in our 60-Hertz example.

The following is a discussion of how to obtain the highest number of unique sampled points over a measurement period. The highest number of sampled points N where N is an integer is found by dividing the specified maximum sampling rate $F_{clk,\ max}$ of the sampling ADC 20 by the frequency $F_{in}$ of the input signal, and rounding the resultant down to the nearest integer. In equation form, this is $$N = \text{integer}(F_{clk,\ max}/F_{in}). \tag{4}$$

The highest number of whole cycles M (where M is an integer) is found by multiplying the specified maximum measurement time $T_{max}$ of DSP 24 by the frequency $F_{in}$ of the input signal, and rounding the resultant down to the nearest integer. In equation form, this is $$M = \text{integer}(F_{in} T_{max}). \tag{5}$$

Now the actual measurement period $T_{meas}$ can be determined as $T_{meas} = M/F_{in}$.

Since the maximum number of points to be sampled over the measurement period $T_{meas}$ is M times N point, it would seem that the time τ between samples, and hence the sampling clock rate, could be determined from $T_{meas}/MN$. But this would result in the same points being sampled on each cycle. Therefore, a slight incremental time Δt must be built in as a sample interpolation delay to slightly shift the sampling points on each cycle so that no point is sampled twice over the measurement period $T_{meas}$. If we choose Δt=τ/MN, or the time for one sampling clock period, then we can define τ as follows:

$$\tau = (T_{meas}/MN) + (\tau/MN) = T_{meas}/(MN-1). \tag{6}$$

Finally, the highest practical sampling clock frequency is determined as $$F_{clk} = F_{in}((MN-1)/M). \tag{7}$$

By way of summary, operation of the system of FIG. 1 to provide a precision RMS measurement will be described in conjunction with the program shown in FIG. 4. In step 40, the precision ADC 16 and DSP 24 are initialized to begin a measurement. In step 42, the highest practical sampling speed $F_{CLK}$ is determined from equations (4) through (7). In step 44, the DC average voltage is measured by ADC 16. In step 46, DSP 24 acquires n digitized samples per cycle over m cycles of AC or time-varying cyclic signal. In step 48, DSP 24 calculates the RMS and average voltage values from the digitized samples. Steps 44 and 46 may be carried out concurrently. In step 50, the RMS voltage value $V_{RMS}$ is calculated from equation (3). Finally, step 52, the RMS voltage value is displayed on display device 28.

While I have shown and described the preferred embodiment of my invention, it will be apparent to those skilled in the art that many changes and modifications may be made without departing from my invention in its broader aspects. It is therefore contemplated that the appended claims will cover all such changes and modifications as fall within the true scope of the invention.

What I claim as my invention is:

1. A method of measuring RMS voltage of a-cyclic time-varying signal, comprising the steps of:

obtaining from said cyclic time varying signal a precise DC average voltage thereof;

sampling said cyclic time varying signal and producing a stream of digitized samples representative of instantaneous points along said time varying signal;

calculating from said digitized samples an RMS voltage value and an average voltage value of said cyclic time varying signal, and then calculating the ratio of the RMS voltage value to the average voltage value; and multiplying said precise DC average voltage average by said ratio to obtain said RMS voltage.

2. A system for measuring RMS voltage of a cyclic time-varying signal, comprising:

an AC-to-DC converter for converting said cyclic time-varying signal to a precise DC average voltage;

a precision analog-to-digital converter coupled to said AC-to-DC converter for converting said precise DC average voltage to a digital representative of said precise DC average voltage;

a fast sampling analog-to-digital converter for sampling said cyclic time varying signal and producing a stream of digitized samples representative of instantaneous points along said time varying signal;

a processor for receiving said digitized samples and calculating therefrom a calculated RMS voltage value and a calculated average voltage value of said cyclic time varying signal, and then calculating the ratio of the calculated RMS voltage value to the calculated average voltage value; said processor further receiving said digital representation of said precise DC average voltage and multiplying said precise DC average voltage average by said ratio to obtain said RMS voltage; and a display device for displaying said RMS voltage.

3. A system for measuring RMS voltage of a cyclic time-varying signal in accordance with claim 2 wherein said processor collects n digitized samples from said fast sampling analog-to-digital converter over m cycles of time-varying. signal.

4. A system for measuring RMS voltage of a cyclic time-varying signal in accordance with claim 2, further comprising:

a frequency counter adapted to receive said cyclic time-varying signal and determine the frequency thereof, wherein said processor receives an output form said frequency counter and calculates a time period for m cycles of said cyclic time-varying signal.

* * * * *